US006635916B2

United States Patent
Aton

(10) Patent No.: US 6,635,916 B2
(45) Date of Patent: Oct. 21, 2003

(54) ON-CHIP CAPACITOR

(75) Inventor: Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/935,519

(22) Filed: Aug. 23, 2001

(65) Prior Publication Data

US 2002/0024087 A1 Feb. 28, 2002

Related U.S. Application Data

(60) Provisional application No. 60/229,488, filed on Aug. 31, 2000.

(51) Int. Cl.[7] .................. H01L 27/108; H01L 29/76; H01L 29/94; H01L 31/119
(52) U.S. Cl. ....................... 257/306; 257/307
(58) Field of Search ............... 257/296, 303, 257/306, 307, 310

(56) References Cited

U.S. PATENT DOCUMENTS

| | | | |
|---|---|---|---|
| 5,208,725 A | 5/1993 | Akcasu | |
| 5,583,359 A | 12/1996 | Ng et al. | |
| 5,736,448 A | 4/1998 | Saia et al. | |
| 6,025,226 A | 2/2000 | Gambino et al. | |
| 6,037,621 A * | 3/2000 | Wilson | 257/296 |
| 6,066,537 A | 5/2000 | Poh | |
| 6,133,079 A | 10/2000 | Zhu et al. | |
| 6,146,939 A * | 11/2000 | Dasgupta | 257/306 |
| 6,200,629 B1 | 3/2001 | Sun | |
| 6,297,524 B1 * | 10/2001 | Vathulya et al. | 257/296 |
| 6,365,954 B1 | 4/2002 | Dasgupta | |
| 2001/0019144 A1 | 9/2001 | Roy | |
| 2001/0045667 A1 | 11/2001 | Yamauchi et al. | |
| 2002/0022331 A1 | 2/2002 | Saran | |

\* cited by examiner

Primary Examiner—Long Pham
Assistant Examiner—Hoai Pham
(74) Attorney, Agent, or Firm—Michael K. Skrehot; Wade James Brady, III; Frederick J. Telecky, Jr.

(57) ABSTRACT

An on-chip analog capacitor. Metal interconnect structures are used to form the capacitor, and the interdigitated fingers of like polarity within the interconnect structure are connected above and below to one another by metal vias to form a wall of metal which increases total capacitance by taking advantage of the via sidewall capacitance.

13 Claims, 4 Drawing Sheets

ON-CHIP CAPACITOR

This application claims priority under 35 USC §119(e)(1) of provisional application No. 60/229,488 filed Aug. 31, 2000.

BACKGROUND AND SUMMARY OF THE INVENTION

The present invention relates to integrated circuit structures, and particularly to on-chip capacitors.

BACKGROUND

In integrated circuit fabrication, many devices are placed on a single substrate. The various devices must be electrically isolated from one another, but some specific devices must be electrically interconnected to implement a desired circuit function. Many circuits require more than one level of interconnect, so multi-level interconnect structures are used.

One aim of integrated circuit technology is an increase in device speed. This objective has caused integrated circuit fabrication to seek ways of scaling down devices, increasing the functional complexity of the integrated circuit as a whole. However, downscaling of ICs, and therefore speed, is limited by interconnect technology. One problem with multi-level interconnect structures is the filling of high aspect ratio and varying depth contact holes and vias. Many processes have been developed to address these issues. Another problem is the tendency of closely situated conductors to crosstalk, where potential change in one line affects performance of a nearby line.

The damascene process is one method of forming metallized patterns on ICs. First a conductor pattern is etched into a dielectric layer to form grooves within the dielectric layer. A metal is then deposited to fill the etched grooves. Often an interim step is included wherein a diffusion barrier material is deposited on the walls and bottom of the groove to prevent diffusion of the deposited metal into the surrounding dielectric areas. The deposited metal typically covers not only the grooves but the entire surface of the wafer, depending on the method of deposition. This excess metal is removed using a chemical mechanical polish (CMP). This leaves a smooth surface with inlaid metal fingers within the grooves of the dielectric material.

The dual damascene process consists of forming vias and interconnect patterns in the dielectric layer at the same time the original groove is etched. This is followed by a single metal fill that deposits metal in both the grooves and the vias, followed by a polish. The vias in a dual damascene process are often as wide as the metal layer grooves themselves.

Multi-level interconnect structures are also used to form on-chip capacitors. These typically consist of stacked metallized lines connected to two buses which provide the two terminals of the capacitor. Different bus connections are used to give different lines a different polarity. Typically, lines of different polarity are interdigitated, forming a pattern of lines having first one potential, then another.

FIG. 2a shows a conventional on-chip capacitor formed using the existing metal interconnect structure. Note that lines of one polarity are both vertically and laterally adjacent lines of opposite polarity; thus in cross section the conventional has a checkerboard layout.

For many applications, on-chip capacitors are formed from these existing structures of metal lines of alternating polarity. In typical prior art on-chip capacitor structures, multiple levels of interdigitated different polarity metal lines are stacked atop one another (using the above discussed fabrication techniques) to form stacks of metal interconnects. Typically, the metal lines above and below one another are of alternating polarity. Since these metal lines are separated by a dielectric material, they can be used to form on-chip capacitors.

Specifically, CMOS processes for analog applications construct capacitors using these metal interconnects. These structures typically use both the sidewall capacitance (i.e., the capacitance between lines within a single layer) and the "top-bottom" capacitance (i.e., capacitance between two metal lines in adjacent levels of the interconnect structure).

The present application teaches an improvement to on-chip capacitor formation, as discussed below.

ON-CHIP CAPACITOR

The present application discloses a new on-chip capacitor. The vertical stacks of metal lines are oriented so that vertically adjacent lines have the same potential polarity, rather than different polarity. The lines above and below one another are extensively connected by vias, which increases the intralevel or "sidewall" capacitance of the whole structure (metallization plus via). This necessarily eliminates the top-bottom capacitance contribution provided by vertically adjacent lines of opposite polarity. Though stacking the interconnects in a non-alternating vertical polarity and connecting the vertical stacks by vias sacrifices the interlevel capacitance, the increase in intralevel capacitance more than outweighs this loss. Because the via side wall capacitance can take advantage of a higher dielectric material in its sidewall capacitance, this increases the on-chip capacitance even more.

In one class of embodiments, the vias in the present innovative on-chip capacitor can be extended the entire length of the metal interconnect lines to form walls of metal, increasing intralevel capacitance even further. Likewise, the dielectric constants between the levels (interlevel dielectrics, or ILDs) can be made of a higher dielectric constant material than the gap fill dielectric, or intrametal dielectric fills. This will increase the capacitance between metal lines, increasing on-chip capacitance even more.

The present innovations are particularly useful in that, in some embodiments, they can use the advantages of the dual damascene process or creating metal interconnects, since the metal lines above and below one another are of like polarity. In the dual damascene process, the vias can be made as wide (or wider) than the metal lines themselves, which also increases total capacitance. A further advantage is that in the dual damascene process the dielectric which laterally separates vias does not have to be the same as that which separates metal lines.

Finally, vias can extend above the top-most metal interconnect line and below the bottom-most interconnect line to form "blind" vias, increasing the total area of metal and increasing the total capacitance.

Advantages of the disclosed methods and structures, in various embodiments, can include one or more of the following:
  greater on-chip capacitance;
  minimal alteration of process;
  smaller size for the same capacitance;
  connections on only one level since the other levels are connected by vias.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
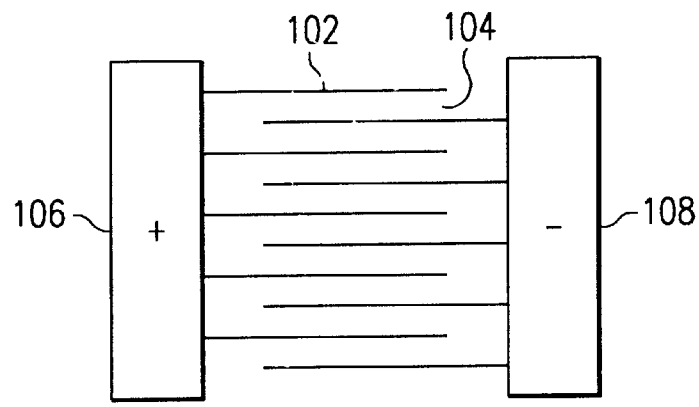
FIG. 1 shows a top view of an interconnect structure.

The preferred embodiment is described with reference to the figures. FIG. 1 shows the top view of an interconnect layer in a CMOS process. Metallization lines 102 are located in close proximity to one another separated by dielectric material 104. Lines of like polarity are connected to a common bus. FIG. 1 shows two busses 106, 108. For purposes of discussion, one bus 106 is labeled "+" while the other 108 is labeled "−". The potential difference between metal structures in proximity to one another can create a capacitance. Instead of relying on vertical (interlevel) capacitance, the present innovations create a larger horizontal (intralevel, or sidewall) capacitance, as discussed in detail below.

Figure 2A:
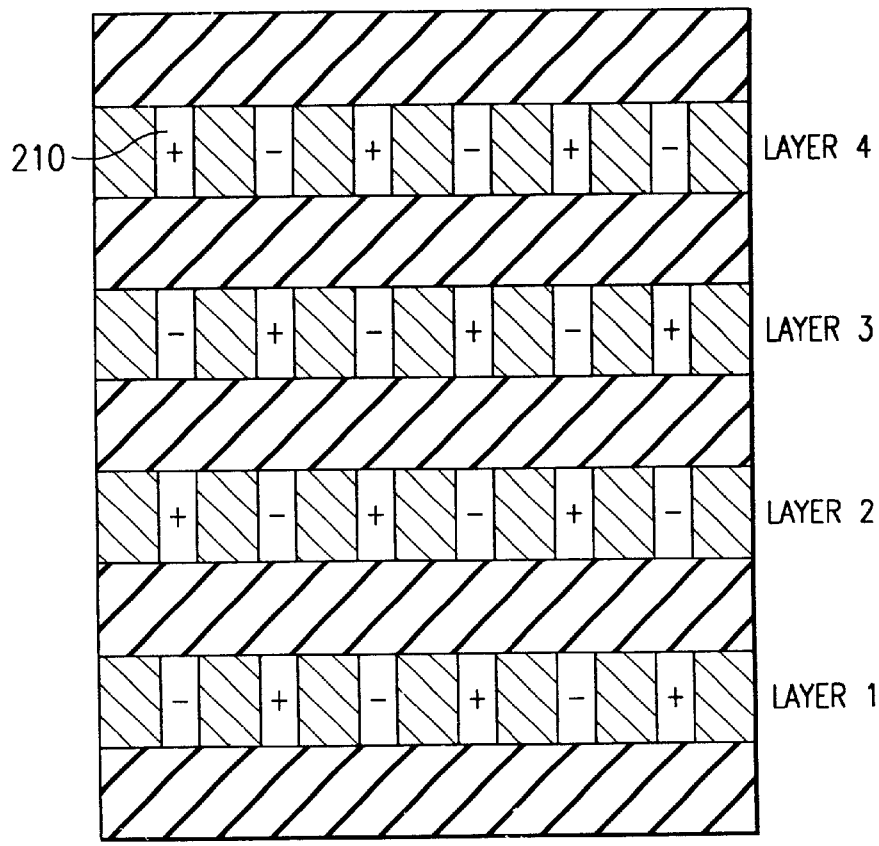
FIG. 2a shows a side view, taken end-on, of an interconnect structure.
Figure 2B:
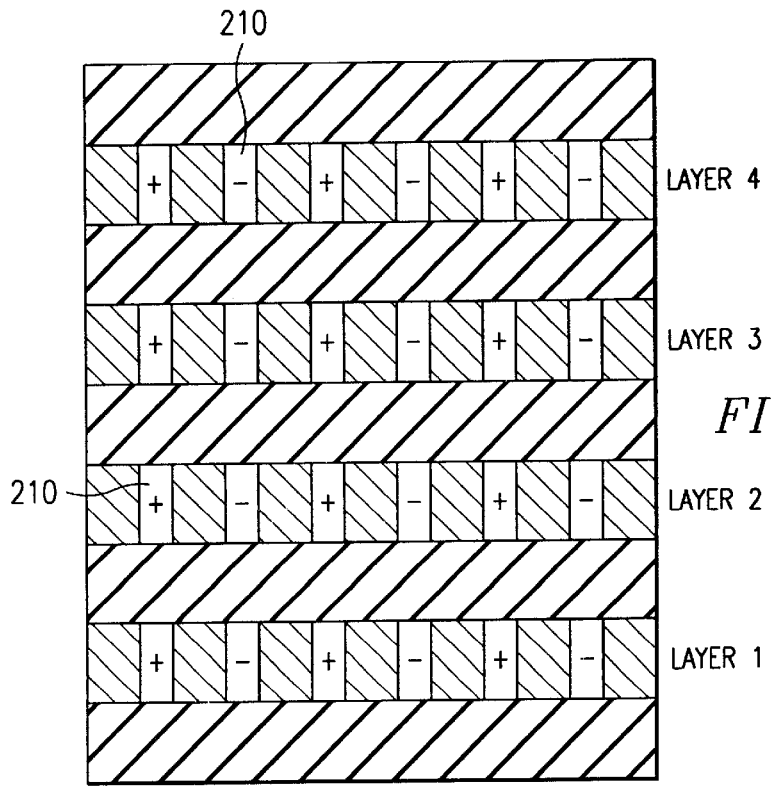
FIG. 2b shows a side view, taken end-on, of an interconnect structure consistent with the preferred embodiment.

FIG. 2a shows a side view of multiple levels of a CMOS process. Metallized lines 210 are shown end-on, with "+" or "−" denoting relative polarities. In a typical process, a set of vertically aligned lines of metal alternate in polarity from level to level to create both interlevel capacitances and intralevel capacitances. Instead, the preferred embodiment employs non-alternating charge of the metal lines from level to level as shown in FIG. 2b. This means the metal line 210 above and below a given line will be at the same polarity as that line. Metal lines within the same level as a given line are still of alternating polarity. This creates the possibility of intralevel capacitance within the structure, and nearly eliminates interlevel capacitance.

However, in modern metalization processes the sidewall capacitance is normally much larger than the level-to-level capacitance (because of the aspect ratio of the metal lines) and the side-to-side distance (which is patterned by lithography) is much smaller than the layer-to-layer distance. The preferred embodiment sacrifices the level-to-level capacitance to take advantage of the increased sidewall capacitance of the vias possible in a "stacked" geometry where lines of similar polarity are above and below each other.

Figure 3:
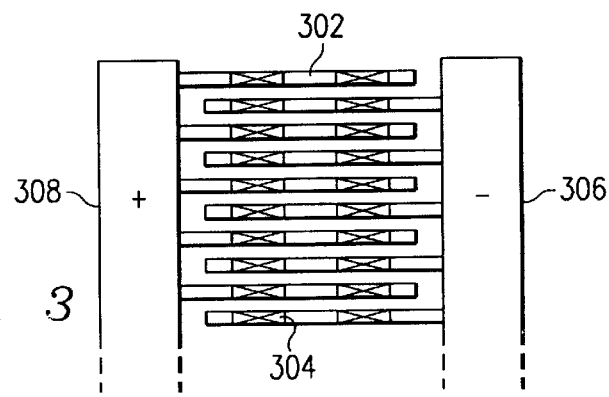
FIG. 3 shows a top view of an interconnect structure with vias shown.
Figure 4:
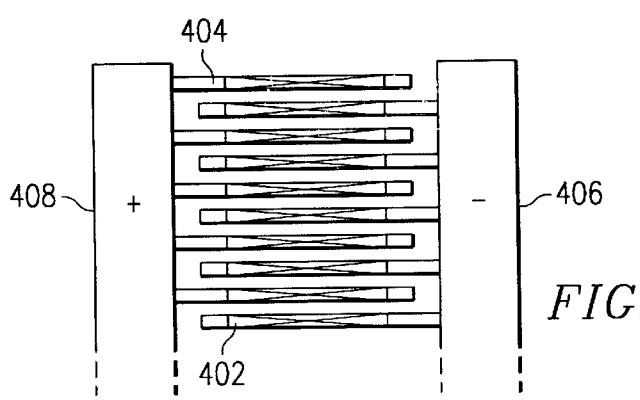
FIG. 4 shows a top view of an interconnect structure with vias shown along the length of the interconnects.

FIG. 3 shows a top view of the preferred embodiment. The interdigitated fingers 302 of the metal lines are connected above and below (if applicable) by vias 304. The vias 304 are marked with an "x". Since the levels are already electrically connected, the vias can be made into trenches that connect all along the length of some, most, or all of the metal lines, forming a wall of metal between lines that effectively extends through several levels. This increase in sidewall area increases capacitance even further. FIG. 4 shows a top view with vias 402 along the entire length of the lines 404, forming continuous walls of metal.

Figure 5:
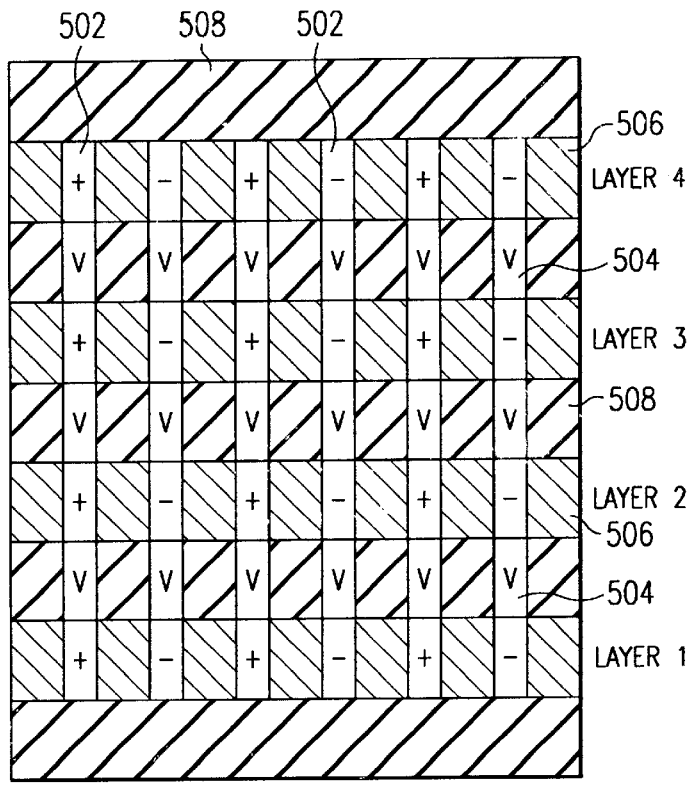
FIG. 5 shows an end-on view of an interconnect structure with vias connecting the metal lines.

FIG. 5 shows a side view. The metallization lines 502 are seen end-on, and vertically aligned lines are of like polarity. Metal vias 504 connect each metal line 502 to the metal lines above and below. Between each metal line is a gap fill dielectric material 506. Between the vias, interlevel dielectric material 508 is shown.

Figure 6:
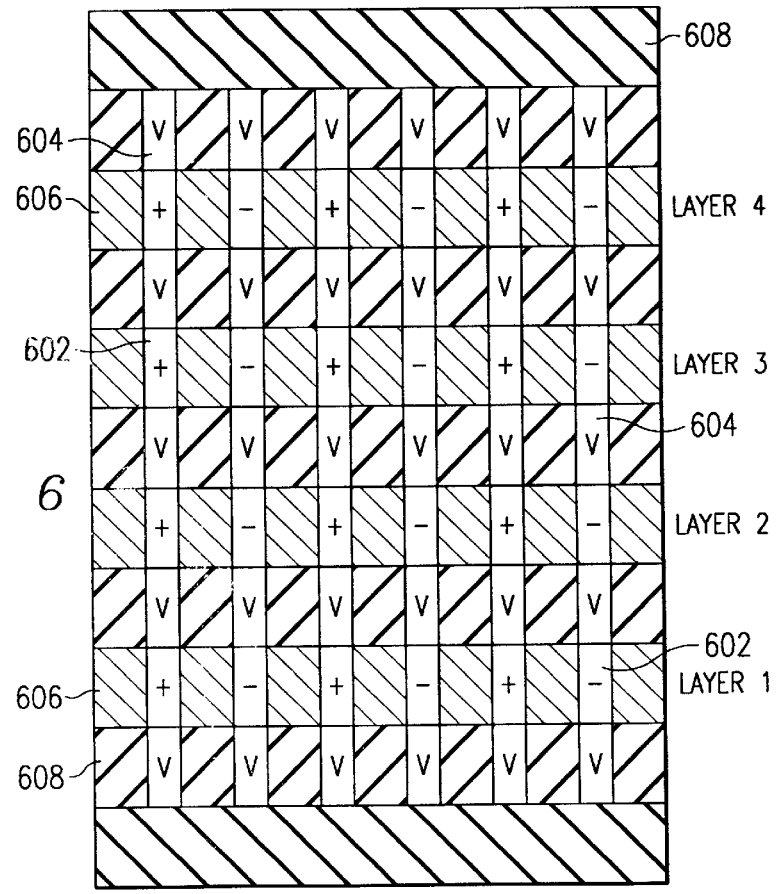
FIG. 6 shows an end-on view of an interconnect structure with vias connecting the metal lines and blind vias extending above and below the topmost and bottommost metal lines, respectively.

The topmost and bottommost metal lines may also be attached to "blind vias," or vias that only connect at one end. This adds more total metal area, increasing capacitance further. FIG. 6 shows a three-level metallization pattern with vias 602 extending between all levels and vias 604 extending above and below the topmost and bottommost levels, respectively.

Figure 7:
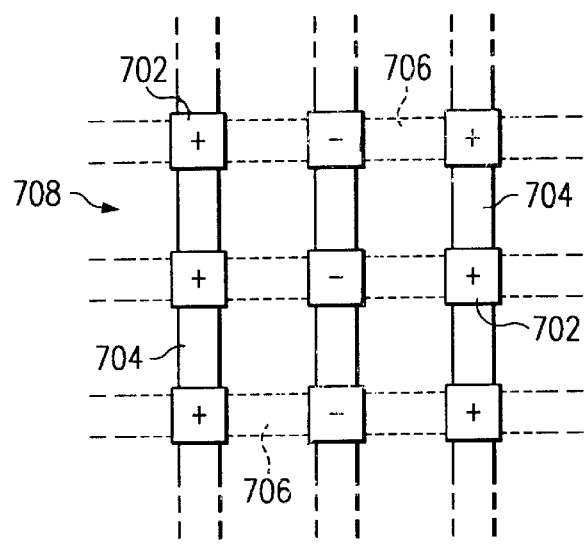
FIG. 7 shows a detailed view of an interconnect structure with layers separated by dashed lines.

The preferred embodiment can also takes advantage of a system with multiple effective dielectric constants (EDC) to further increase the capacitance. Normally, in systems that employ different EDC, the intralevel dielectric constant is made small to decrease the sidewall capacitance and improve the operating speed of driving side-by-side interconnect lines. This works to the disadvantage of maximizing such metal capacitors using sidewall capacitance. The interlevel EDC is however usually much larger since this improves the stability of the lines to crosstalk. In the preferred embodiment, the creation of via sidewall capacitance takes advantage of this higher interlevel EDC to further increase the sidewall capacitance. FIG. 7 shows an example dual EDC system. Metal lines 702 occupy different levels and are connected by vias 704 above and below. The gap fill dielectric material 706 that lies between the metal lines in a single plane will typically have a lower EDC than the gap fill dielectric material 708 that is between the vias. For example, the EDC of 706 might be as low as 2.7 whereas the interlevel material 708 might be as high as 4.0. The presence of the via sidewall capacitance in the higher EDC material 708 may dramatically increase the possible capacitance.

Figure 8:
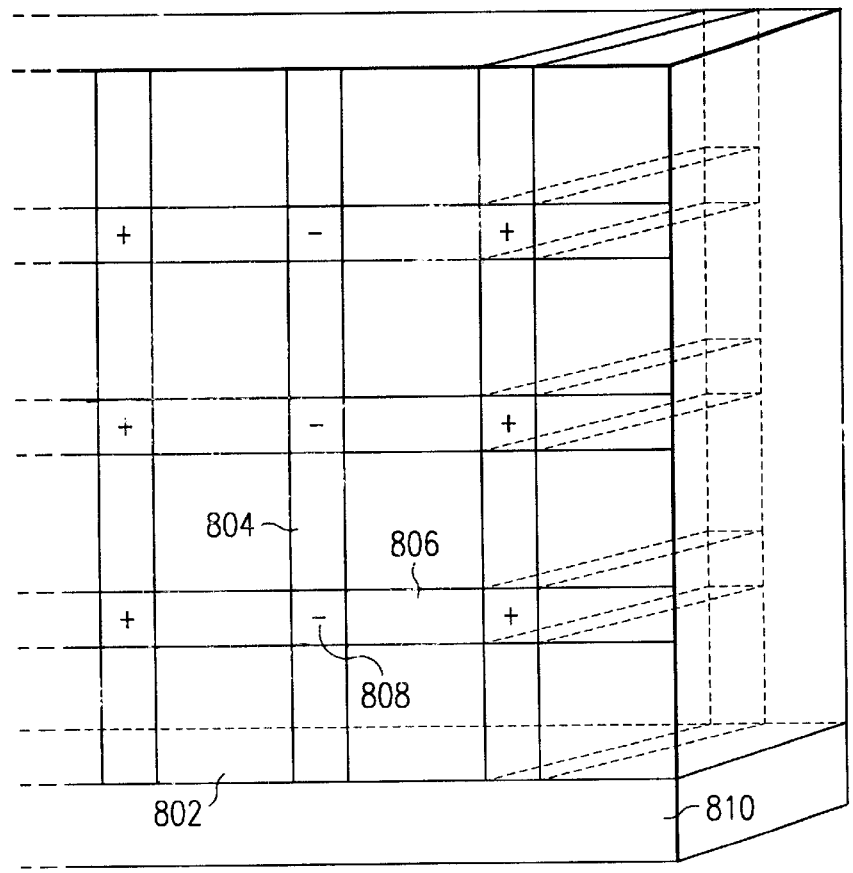
FIG. 8 shows a cut-away view of an interconnect structure.

In a damascene process, where trenches for vias are etched before the metal interconnect layer is formed, the via can often be a slot as wide as the metal lay, forming a continuous wall of metal. Referring to FIG. 8, a first layer of material 802 with dielectric constant 4.0 is deposited on a substrate 810. Trenches 804 are etched in the dielectric layer 802, and filled with a thin layer (not shown) to prevent diffusion of the metal into the dielectric. A trench fill technique is then applied, filling the trenches with copper (in the preferred embodiment). This process can be done by electroplating, CVD, or PVD. The excess copper from the fill is then removed through a chemical mechanical polish.

Next a material 806 of dielectric constant between 2.7 and 3 is deposited, and trenches 808 are etched for the metal layers. These trenches are filled in the same manner as the vias trenches were filled, and then polished. Depending on the process requirements, this is repeated forming multiple levels of metallized fingers connected above and below by metal vias to form continuous walls of metal deposited with alternating layers of dielectric material in between.

In addition, the rearrangement of the stacking order and the connection of the similarly ordered layers by vias means that the buss connection that connects the capacitor (106 and 108 in FIG. 1 and 306 and 308 in FIG. 3) need only be on one of the metal layers. For convenience it may be on the bottom layer, the top layer or one of the intermediate layers. This has the advantage that the additional routing tracks normally occupied by those busses may be made available for additional other interconnections within the device.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

CVD: Chemical Vapor Deposition—a process of depositing a material on a substrate by the reaction of materials at the substrate surface.

EDC: Effective dielectric constant of a material.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the number of layers of metallization described above does not implicitly limit any of the claims, which can be applied to processes and structures with more or fewer layers.

Likewise, it will be readily recognized that the disclosed inventions are equally applicable to processes with multiple layers of metal (and in fact would be most commonly used in such processes).

Similarly, it will be readily recognized that the described process steps can also be embedded into hybrid process flows, such as BiCMOS or smart-power processes.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

An example of a low dielectric constant material compatible with the present innovations is $SiO_xF_y$, and an example of a high dielectric constant material is $SiO_xN_y$. However, of course other materials can be used.

The metal lines will preferably have minimum width, which is determined by the design rules of the process being used. However, alternatively, the metal lines could be given greater than minimum width if a high-Q capacitor is required. In either case, the lateral separation between the metal lines, and between the vias, will preferably be kept at the minimum unless a higher breakdown voltage is desired.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTI-LEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. An on-chip capacitor, comprising:

first and second metal line patterns each in first and second levels;

wherein said first pattern of said first level is connected to said first pattern of said second level by conducting vias;

wherein said second pattern of said first level is connected to said second pattern of said second level by conducting vias;

wherein said first pattern and said second pattern form contacts for said capacitor; and wherein said vias extend over greater than half the length of said first and said second metal line patterns where said patterns face each other.

2. The capacitor of claim 1, wherein said first and second levels are separated by a material of first dielectric constant, and said first and second patterns are separated by a material of a second dielectric constant, and wherein said first dielectric constant is greater than said second dielectric constant.

3. The capacitor of claim 1, wherein vias extend from said first and said second metal line patterns and do not connect to metal line patterns of any other level.

4. An integrated circuit structure, comprising:

a first layer having a first metallization pattern comprising at least two metal lines;

a second layer having a second metallization pattern comprising at least two metal lines;

wherein said first and second metallization patterns are connected by conducting vias to form a capacitance; and wherein said first and second metallization patterns are separated by a material of a first dielectric constant, and said vias are separated by a material of a second dielectric constant, said second dielectric constant being greater than said first dielectric constant.

5. The integrated circuit of claim 4, wherein said vias extend at least half the length of said first and said second metallization patterns where they face each other.

6. The integrated circuit of claim 4, further comprising vias extending from said first and second metallization patterns of said first layer that do not connect to any other metallization patterns.

7. An on-chip capacitor, comprising:

a first stack of metal lines;

a second stack of metal lines laterally separated from said first stack by a first dielectric material;

wherein two or more of said metal lines of said first stack are vertically connected by conducting vias wherein two or more of said second stack are vertically connected by conducting vias;

wherein said first stack and said second stack provide two terminals of a capacitor; and wherein said vias are laterally separated by a second dielectric material, and said dielectric constant of said second dielectric material is greater than the dielectric constant of said first dielectric material.

8. The capacitor of claim 7, wherein said vias extend over half the length of said metal lines to which they connect.

9. An on-chip capacitor, comprising:

first and second interdigitated metal patterns providing lateral capacitance therebetween;

elongated vias which provide lateral capacitance therebetween, and which are parallel to one another and electrically connected to each of said first and second patterns;

wherein said first and second metal patterns, in combination with said elongated vias, define a capacitor.

10. The capacitor of claim 9, wherein said elongated vias extend over more than half the peripheral length where said first and said second interdigitated metal patterns face each other.

11. The capacitor of claim 9, wherein said elongated vias also provide vertical connection from said respective metal patterns to corresponding metal patterns in one or more other layers of metallization.

12. The capacitor of claim 9, wherein said elongated vias provide more lateral capacitance than said interdigitated metal patterns do.

13. The capacitor of claim 9, further comprising vias attached to said first and second patterns that do not connect to any other metal patterns.

* * * * *